United States Patent
Hanson et al.

(10) Patent No.: US 11,272,624 B2
(45) Date of Patent: Mar. 8, 2022

(54) COATED ARTICLES THAT DEMONSTRATE PUSH-THROUGH ELECTRICAL CONNECTIVITY

(71) Applicant: Aculon, Inc, San Diego, CA (US)

(72) Inventors: Eric Hanson, Encinitas, CA (US); Joshua Garretson, San Diego, CA (US)

(73) Assignee: ACULON INC., San Diego, CA (US)

( * ) Notice: Subject to any disclaimer, the term of this patent is extended or adjusted under 35 U.S.C. 154(b) by 340 days.

(21) Appl. No.: 16/245,718

(22) Filed: Jan. 11, 2019

(65) Prior Publication Data

US 2019/0150294 A1 May 16, 2019

Related U.S. Application Data

(63) Continuation-in-part of application No. PCT/US2017/042054, filed on Jul. 14, 2017.

(60) Provisional application No. 62/362,686, filed on Jul. 15, 2016.

(51) Int. Cl.
*H05K 3/28* (2006.01)
*H05K 3/34* (2006.01)

(52) U.S. Cl.
CPC ............. *H05K 3/284* (2013.01); *H05K 3/285* (2013.01); *H05K 3/3452* (2013.01); *H05K 2203/1327* (2013.01)

(58) Field of Classification Search
CPC ...... H05K 3/284; H05K 3/285; H05K 3/3452; H05K 2203/1327
See application file for complete search history.

(56) References Cited

U.S. PATENT DOCUMENTS

| | | | | | |
|---|---|---|---|---|---|
| 4,146,672 | A | * | 3/1979 | Jasperson | D06N 3/042 428/332 |
| 4,256,804 | A | * | 3/1981 | Jasperson | B32B 7/02 428/332 |
| 4,345,057 | A | * | 8/1982 | Yamabe | C08F 214/186 526/247 |
| 5,349,747 | A | * | 9/1994 | Dennis | B60R 16/0232 29/832 |
| 5,580,630 | A | * | 12/1996 | Byrd | E04D 5/10 428/143 |
| 5,955,203 | A | * | 9/1999 | Briggs | B32B 5/02 428/460 |
| 7,601,426 | B1 | * | 10/2009 | Wilson | C08G 59/5006 428/418 |
| 8,524,367 | B2 | * | 9/2013 | Hanson | B05D 1/185 428/411.1 |
| 8,859,638 | B1 | * | 10/2014 | Molnar | C08J 3/11 523/122 |
| 2003/0153682 | A1 | * | 8/2003 | Sakugawa | C08G 77/42 525/100 |
| 2004/0250969 | A1 | * | 12/2004 | Luu | B32B 23/10 162/123 |
| 2005/0261407 | A1 | * | 11/2005 | Khan | C09D 5/004 524/405 |
| 2006/0007059 | A1 | * | 1/2006 | Bell | A41D 27/085 345/55 |
| 2007/0015863 | A1 | * | 1/2007 | Matsunage | C08L 53/00 524/505 |
| 2010/0025091 | A1 | * | 2/2010 | Ferdinandi | H05K 3/282 174/257 |
| 2011/0166259 | A1 | * | 7/2011 | Butikofer | C08G 59/18 523/401 |
| 2012/0004388 | A1 | * | 1/2012 | Hanson | B05D 1/185 528/395 |
| 2012/0012251 | A1 | * | 1/2012 | Burckhardt | C08G 18/10 156/331.7 |
| 2012/0322913 | A1 | * | 12/2012 | Fontenot, III | C08J 3/22 523/351 |
| 2014/0044956 | A1 | * | 2/2014 | McGroarty | E02D 19/18 428/325 |
| 2014/0107313 | A1 | * | 4/2014 | Burckhardt | C07C 211/27 528/87 |
| 2014/0128506 | A1 | * | 5/2014 | Kramer | C08G 59/50 523/400 |
| 2014/0228506 | A1 | * | 8/2014 | Molnar | C09D 7/00 524/533 |
| 2014/0288247 | A1 | * | 9/2014 | Burckhardt | C08G 59/184 525/523 |
| 2014/0357755 | A1 | * | 12/2014 | Zhu | C08L 23/16 523/122 |

FOREIGN PATENT DOCUMENTS

| WO | 2008102113 | 8/2008 |
|---|---|---|
| WO | 2018013889 | 1/2018 |

* cited by examiner

*Primary Examiner* — Timothy J Thompson
*Assistant Examiner* — Rhadames Alonzo Miller
(74) *Attorney, Agent, or Firm* — Blynn L. Shideler; Krisanne Shideler; BLK Law Group

(57) ABSTRACT

Coated articles are provided comprising:
(a) a substrate that demonstrates electrical conductivity; and
(b) a coating layer applied to at least one surface of the substrate;
wherein the coating layer demonstrates push-through electrical connectivity. The coated articles are particularly suitable for use in circuit assemblies.

18 Claims, No Drawings

COATED ARTICLES THAT DEMONSTRATE PUSH-THROUGH ELECTRICAL CONNECTIVITY

CROSS REFERENCE TO RELATED APPLICATIONS

This application is a continuation-in-part of PCT International patent application number PCT/US2017/042054, filed Jul. 14, 2017, entitled: "COATED ARTICLES THAT DEMONSTRATE PUSH-THROUGH ELECTRICAL CONNECTIVITY", which in turn claims priority to U.S. Provisional Patent Application Ser. No. 62/362,686, filed Jul. 15, 2016, entitled: "COATED ARTICLES THAT DEMONSTRATE PUSH-THROUGH ELECTRICAL CONNECTIVITY AND FILM-FORMING COMPOSITIONS USED THEREIN", both of which are incorporated herein by reference in their entireties.

FIELD OF THE INVENTION

The present invention relates to coated articles that demonstrate push-through electrical connectivity.

BACKGROUND OF THE INVENTION

An electronic circuit package, or assembly, comprises many individual components including, for example, resistors, transistors, capacitors, etc. These components are interconnected to form circuits, and circuits are likewise interconnected to form units having specific functions. In microelectronic circuit packages, circuits and units are prepared in packaging levels of increasing scale. The smallest scale packaging levels are typically semiconductor chips housing multiple microcircuits and/or other components. Such chips are usually made from ceramics, silicon, and the like. Intermediate package levels ("chip carriers") comprising multi-layer substrates may have attached thereto a plurality of small-scale chips housing many microelectronic circuits. The intermediate package levels serve several purposes in the circuit assembly including structural support, transitional integration of the smaller scale microcircuits and circuits to larger scale boards, and the dissipation of heat from the circuit assembly. In turn, these intermediate package levels are themselves attached to larger scale circuit cards, motherboards, and the like.

Miniaturization of electronic circuitry places tremendous pressure and challenges on manufacturers, such as incorporating water resistance. Traditionally, thick encapsulating coatings or mechanical gasketing have been used; however continued miniaturization has made these technologies difficult and costly to incorporate as many parts of the board must be masked to avoid insulating press-fit connectors or damaging sensitive components such as microphones.

Commercially available water-resistant products include conformal solution-based hydro/oleophobic coatings, which repel fluids but require some level of masking or "keep-out" areas, and vacuum-deposited coatings (which also require masking) such as parylene-based treatments.

It would be desirable to provide coated articles that may deliver the benefits of conformal coatings yet eliminate the need for costly capital investment and avoid the bottlenecking caused by vacuum-based batch manufacturing processes or masking operations.

SUMMARY OF THE INVENTION

Coated articles are provided comprising:
(a) a substrate that demonstrates electrical conductivity; and
(b) a coating layer applied to at least one surface of the substrate;
wherein the coating layer demonstrates push-through electrical connectivity.

DETAILED DESCRIPTION OF THE INVENTION

Other than in any operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

As used in this specification and the appended claims, the articles "a," "an," and "the" include plural referents unless expressly and unequivocally limited to one referent.

The various aspects and examples of the present invention as presented herein are each understood to be non-limiting with respect to the scope of the invention.

As used in the following description and claims, the following terms have the meanings indicated below:

The term "reactive" refers to a functional group capable of undergoing a chemical reaction with itself and/or other functional groups spontaneously or upon the application of heat or in the presence of a catalyst or by any other means known to those skilled in the art.

The terms "on", "appended to", "affixed to", "bonded to", "adhered to", or terms of like import means that the designated item, e.g., a coating, film or layer, is either directly connected to (in contact with) the object surface, or indirectly connected to the object surface, e.g., through one or more other coatings, films or layers.

The coated articles of the present invention comprise a substrate (a) that demonstrates electrical conductivity. Substrates suitable for use in the preparation of the coated articles of the present invention can include a metal such as copper or steel, or any substrate commonly used in the preparation of circuit assemblies, such as polyepoxides, including fiberglass reinforced polyepoxides, polyimides, phenolics, and fluorocarbons. The polymeric substrates may comprise an electrically conductive circuit pattern imprinted in (such as in the case of a blind via) or on the substrate surface. Often the substrate is an electronic component of a circuit assembly, such as a printed circuit board.

The substrate may take any shape as desired for the intended application, such as flat, curved, bowl-shaped, tubular, or freeform. For example, the substrate may be in the form of a flat plate having two opposing surfaces, such as would be suitable for use in an electronic circuit assembly as a circuit board.

Prior to application of any coatings, the substrate may be cleaned such as by argon plasma treatment or with a solvent such as Ionox 13416 or Cybersolv 141-R, both available from Kyzen.

The coated articles of the present invention further comprise a coating layer (b) applied to at least one surface of the substrate. The coating layer comprises a material that allows for push-through electrical connectivity, which is necessary for the operability of a circuit assembly. By "push-through electrical connectivity" is meant that an electrically conductive wire or other component can be pushed through the coating layer by piercing or cutting through it to establish an electrical connection with the underlying substrate, without fracturing, chipping, cracking, or otherwise damaging the continuity of the coating layer to cause failure. The coating layer is soft enough that it can be pierced without causing the coating to crack or compromise its electrical insulating properties. The coating layer may be soft due to the composition (and hence $T_g$) of polymers in the coating. Alternatively, assembly of the circuit components (i.e., manufacturing of the circuit) may be done prior to drying of the coating layer on the substrate, or the dried coating layer may be softened on the substrate by application of a solvent to the dried coating surface immediately prior to assembly of the circuit components. This is particularly useful when the coating layer comprises a fluorinated polymer (fluoropolymer) in a fluorinated solvent (fluorosolvent) as described below.

Numerous film-forming compositions may be used to form the coating layer. An exemplary film-forming composition comprises a polysiloxane and an organometallic compound in a solvent. The polysiloxane may be alkyl and/or aryl substituted; poly(methylphenyl)siloxane and/or polydimethylsiloxane are often used. The polysiloxane additionally comprises terminal groups such as terminal methyl and/or silanol groups. The amount of polysiloxane present in the composition used to prepare the coating layer is typically 2 to 50 percent by weight, based on the total weight of the composition.

The organometallic compound is derived from an organo metal in which the metal comprises a transition metal. Transition metals include elements in the d-block of the periodic table (i.e., having valence electrons in the d orbital), as well as those in the f-block (the lanthanide and actinide series, also called "inner transition metals", having valence electrons in the f orbital.) Typically the metal is selected from at least one of La, Hf, Ta, W, and niobium. The organo portion of the metal is usually an alkoxide containing from 1 to 18, often 2 to 8 carbon atoms such as ethoxide, propoxide, isopropoxide, butoxide, isobutoxide and tertiary butoxide. The alkoxides may be in the form of simple esters and polymeric forms of the esters. For example, with the metal Ta, the simple esters would be $Ta(OR)_5$ where each R is independently $C_1$ to $C_{18}$ alkyl. Polymeric esters would be obtained by condensation of the alkyl esters mentioned above and typically would have the structure: RO—[Ta(OR)$_3$—O—]$_x$R where each R is independently defined as above and x is a positive integer. Besides alkoxides, other ligands can be present such as acetyl acetonates. Also, ligands such as chloride, acetylacetonate, alkanolamine and lactate, etc. may be present.

Although not intending to be bound by any theory, it is believed that upon application of the coating layer to the substrate, the organometallic compound forms a polymeric metal oxide of the structure $[M(O)_x(OH)_y(OR)_z]_n$, in which M is a transition metal as discussed above. R may be an alkyl group containing from 1 to 30 carbon atoms; $x+y+z=V$, wherein V is the valence of M; x is at least 1; y is at least 1; z is at least 1; $x=V-y-z$; $y=V-x-z$; $z=V-x-y$; and n is greater than 2.

Suitable solvents for use in the composition used to form the coating layer may be organic or inorganic. Exemplary organic solvents include alcohols such as methanol, ethanol and propanol, aliphatic hydrocarbons such as hexane, isooctane and decane; ethers, for example, tetrahydrofuran, and dialkylethers such as diethylether. The concentration of the organometallic compound in the composition is not particularly critical but is usually at least 0.01 millimolar, typically from 0.01 to 100 millimolar, and more typically from 0.1 to 50 millimolar. Commercially available examples of such compositions include NANOPROOF 3.5 and 4.0, available from Aculon, Inc.

Alternatively, the coating layer may be formed from a film-forming composition comprising a fluorinated polymer (fluoropolymer) in a fluorinated solvent (fluorosolvent). Nonlimiting examples of suitable fluoropolymers include fluoroethylene-alkyl vinyl ether alternating copolymers (such as those described in U.S. Pat. No. 4,345,057) available from Asahi Glass Company under the name LUMIFLON; fluoroaliphatic polymeric esters commercially available from 3M of St. Paul, Minn. under the name FLUORAD; and perfluorinated hydroxyl functional (meth) acrylate resins. The fluoropolymer may, for example, be prepared by polymerizing one or more fluorinated ethylenically unsaturated monomers such as a fluoroethylene or fluoropropylene and fluoro-functional ethylenically unsaturated ester monomers such as fluoro-functional (meth)acrylate monomers and 2-Methyl-2-propenoic acid tridecafluorooctyl ester, with or without non-fluoro-functional ethylenically unsaturated monomers, using conventional polymerization techniques. Fluorinated solvents include EnSolv NEXT solvents, available from Envirotech International. Inc.; VERTREL solvents available from E.I. DuPont de Nemours; and FLUORINERT, NOVEC, and HFE-7500 fluorosolvents, all available from 3M. Commercially available examples of such compositions suitable as the coating layer (b) include NANOPROOF 5.0, available from Aculon, Inc. Other compositions that may be used to form the coating layer may comprise one or more of sol-gels, aerogels, polysiloxanes, polymeric fluoroalkyl ethers including polyhexafluoropropylene oxide, polyacrylates, and polybutadienes. The compositions may be solventborne or waterborne, such as a latex.

In another example of the present invention, the coating layer may be formed from a film-forming composition comprising a hydrocarbon addition polymer in a hydrocarbon solvent. The hydrocarbon addition polymer may be prepared from any of a number of ethylenically unsaturated monomers such as ethylene, propylene, and the like. Ethylene-propylene-diene compounds (EPDM) are particularly suitable.

Suitable hydrocarbon solvents include any of those indicated by the US EPA as VOC-exempt. Under EPA regulations, a chemical is VOC-exempt if it has vapor pressure of less than 0.1 millimeters of mercury (at 20 degrees Celsius); or, if the vapor pressure is unknown, it (i) consists of more than 12 carbon atoms; or (ii) has a melting point higher than 20 degrees C. and does not sublime (i.e., does not change directly from a solid into a gas without melting). Examples of particular solvents that may be used include methyl cyclohexane, toluene, and/or cyclohexane. In this scenario, the amount of hydrocarbon addition polymer present in the composition used to prepare the coating layer is typically 2 to 50 percent by weight, often 4 to 8 percent by weight, based on the total weight in the film-forming composition.

In an alternative example of the present invention, coating layer may be formed from a film-forming composition comprising at least one terpolymer in a solvent, wherein the terpolymer is prepared from a reaction mixture comprising ethylene, propylene, and a diene. Such terpolymers are often referred to as EPDM terpolymers. Examples of dienes used to prepare the EPDM terpolymers may include 5-ethylidenenorbornene (ENB) and/or dicyclopentadiene (DCPD). Often the diene is present in the reaction mixture in an amount of at least 3 percent by weight, such as 4 to 10 percent by weight, based on the total weight of monomers in the reaction mixture. Suitable EPDM terpolymers include those commercially available from the Dow Chemical Company under the name NORDEL, such as NORDEL 4570, and available from Lion Elastomers under the name TRILENE. Specific examples include TRILENE 65, 65D, 67, and 77. Mixtures of EPDM terpolymers may also be used, such as a mixture of a relatively low molecular weight polymer (e. g., less than 75,000 Da as measured by GPC using a polystyrene standard) and a relatively high molecular weight polymer (e. g., greater than 75,000 Da as measured by GPC using a polystyrene standard).

Suitable solvents for use with the EPDM terpolymer may be selected from any of those disclosed above.

Adjuvant materials may be present in any of the above film-forming compositions. Examples include fillers, viscosity (rheology) modifying components such as shear thinning or thixotropic compounds, stabilizers such as sterically hindered alcohols and acids, surfactants and anti-static agents.

Suitable fillers include organic or inorganic fillers and are usually particulate or fibrous. The filler comprises particles and/or fibers that can be formed from materials selected from polymeric and nonpolymeric inorganic materials, polymeric and nonpolymeric organic materials, composite materials, and mixtures of any of the foregoing. The surface of the filler can be modified in any manner well known in the art, including, but not limited to, chemically or physically changing its surface characteristics using techniques known in the art.

For example, a particle or fiber can be formed from a primary material that is coated, clad or encapsulated with one or more secondary materials to form a composite that has a softer surface. Alternatively, fillers formed from composite materials can be formed from a primary material that is coated, clad or encapsulated with a different form of the primary material.

Suitable inorganic fillers can be formed from ceramic materials, metallic materials, and mixtures of any of the foregoing. Suitable ceramic materials comprise metal oxides, metal nitrides, metal carbides, metal sulfides, metal silicates, metal borides, metal carbonates, and mixtures of any of the foregoing. Specific, nonlimiting examples of metal nitrides are, for example boron nitride and aluminum nitride; specific, nonlimiting examples of metal oxides are, for example zinc oxide; nonlimiting examples of suitable metal sulfides are, for example molybdenum disulfide, tantalum disulfide, tungsten disulfide, and zinc sulfide; nonlimiting suitable examples of metal silicates are, for example aluminum silicates and magnesium silicates such as vermiculite.

Particulate fillers can comprise, for example a core of essentially a single inorganic oxide such as silica (including functionalized silica) in colloidal, fumed, or amorphous form, alumina or colloidal alumina, titanium dioxide, cesium oxide, yttrium oxide, colloidal yttria, zirconia, e.g., colloidal or amorphous zirconia, and mixtures of any of the foregoing; or an inorganic oxide of one type upon which is deposited an organic oxide of another type.

Nonpolymeric, inorganic materials useful in forming the fillers used in the present invention comprise inorganic materials selected from graphite, nonconductive diamond, metals, oxides, carbides, nitrides, borides, sulfides, silicates, carbonates, sulfates, and hydroxides. A nonlimiting example of a useful inorganic oxide is zinc oxide. Nonlimiting examples of suitable inorganic sulfides include molybdenum disulfide, tantalum disulfide, tungsten disulfide, and zinc sulfide. Nonlimiting examples of useful inorganic silicates include aluminum silicates and magnesium silicates, such as vermiculite. Nonlimiting examples of suitable metals include molybdenum, platinum, palladium, nickel, aluminum, copper, gold, iron, silver, alloys, and mixtures of any of the foregoing.

In certain embodiments, the particles are selected from fumed silica, amorphous silica, colloidal silica, alumina, colloidal alumina, titanium dioxide, cesium oxide, yttrium oxide, colloidal yttria, zirconia, colloidal zirconia, and mixtures of any of the foregoing.

As another alternative, a particle can be formed from a primary material that is coated, clad or encapsulated with one or more secondary materials to form a composite material that has a harder surface. Also, a particle can be formed from a primary material that is coated, clad or encapsulated with a differing form of the primary material to form a composite material that has a harder surface.

In one example, an inorganic particle formed from an inorganic material such as silicon carbide or aluminum nitride can be provided with a silica, carbonate or nanoclay coating to form a useful composite particle. In another example, a silane coupling agent with alkyl side chains can interact with the surface of an inorganic particle formed from an inorganic oxide to provide a useful composite particle having a "softer" surface. Other examples include cladding, encapsulating or coating particles formed from nonpolymeric or polymeric materials with differing nonpolymeric or polymeric materials. A specific nonlimiting example of such composite particles is DUALITE™, which is a synthetic polymeric particle coated with calcium carbonate that is commercially available from Pierce and Stevens Corporation of Buffalo, N.Y.

Particles may have a lamellar structure. Particles having a lamellar structure are composed of sheets or plates of atoms in hexagonal array, with strong bonding within the sheet and weak van der Waals bonding between sheets, providing low shear strength between sheets. A nonlimiting example of a lamellar structure is a hexagonal crystal structure. Inorganic solid particles having a lamellar fullerene (i.e., buckyball) structure also are useful in the present invention.

Nonlimiting examples of suitable materials having a lamellar structure that are useful in forming the fillers used in the present invention include boron nitride, graphite, metal dichalcogenides, mica, talc, gypsum, kaolinite, calcite, cadmium iodide, silver sulfide, and mixtures of any of the foregoing. Suitable metal dichalcogenides include molybdenum disulfide, molybdenum diselenide, tantalum disulfide, tantalum diselenide, tungsten disulfide, tungsten diselenide, and mixtures of any of the foregoing.

The particles can be formed from nonpolymeric, organic materials. Nonlimiting examples of nonpolymeric, organic materials useful in the present invention include, but are not limited to, stearates (such as zinc stearate and aluminum stearate), diamond, carbon black, and stearamide.

The particles can be formed from inorganic polymeric materials. Nonlimiting examples of useful inorganic polymeric materials include polyphosphazenes, polysilanes, polysiloxane, polygeremanes, polymeric sulfur, polymeric selenium, silicones, and mixtures of any of the foregoing. A specific, nonlimiting example of a particle formed from an inorganic polymeric material suitable for use in the present invention is TOSPEARL20, which is a particle formed from cross-linked siloxanes and is commercially available from Toshiba Silicones Company, Ltd. of Japan.

The particles can be formed from synthetic, organic polymeric materials. Nonlimiting examples of suitable organic polymeric materials include, but are not limited to, thermoset materials and thermoplastic materials. Nonlimiting examples of suitable thermoplastic materials include thermoplastic polyesters such as polyethylene terephthalate, polybutylene terephthalate, and polyethylene naphthalate, polycarbonates, polyolefins such as polyethylene, polypropylene, and polyisobutene, acrylic polymers such as copolymers of styrene and an acrylic acid monomer, and polymers containing methacrylate, polyamides, thermoplastic polyurethanes, vinyl polymers, and mixtures of any of the foregoing.

Nonlimiting examples of suitable thermoset materials include thermoset polyesters, vinyl esters, epoxy materials, phenolics, aminoplasts, thermoset polyurethanes, and mixtures of any of the foregoing. A specific, nonlimiting example of a synthetic polymeric particle formed from an epoxy material is an epoxy microgel particle. A thermoset material has formed a crosslinked network. As used herein, a polymeric material is "crosslinked" if it at least partially forms a polymeric network. One skilled in the art will understand that the presence and degree of crosslinking (crosslink density) can be determined by a variety of methods, such as dynamic mechanical thermal analysis (DMTA) using a TA Instruments DMA 2980 DMTA analyzer conducted under nitrogen. This method determines the glass transition temperature and crosslink density of free films of coatings or polymers. These physical properties of a cured material are related to the structure of the crosslinked network.

According to this method, the length, width, and thickness of a sample to be analyzed are first measured, the sample is tightly mounted to the Polymer Laboratories MK III apparatus, and the dimensional measurements are entered into the apparatus. A thermal scan is run at a heating rate of 3.degree. C./min, a frequency of 1 Hz, a strain of 120%, and a static force of 0.01 N, with sample measurements occurring every two seconds. The mode of deformation, glass transition temperature and crosslink density of the sample can be determined according to this method. Higher crosslink density values indicate a higher degree of crosslinking in the coating.

The particles also can be hollow particles formed from materials selected from polymeric and nonpolymeric inorganic materials, polymeric and nonpolymeric organic materials, composite materials, and mixtures of any of the foregoing. Nonlimiting examples of suitable materials from which the hollow particles can be formed are described above. In one embodiment, the hollow particles are hollow glass spheres.

The adjuvants, if present, are individually present in amounts of up to 30 percent by weight based on the non-volatile (solids) content of the composition.

The compositions used to form the coating layer can be prepared by mixing all of the components at the same time with low shear mixing or by combining the ingredients in several steps. The organometallic compounds are reactive with moisture, and care should be taken when organometallic compounds are used that moisture is not introduced with the solvent or adjuvant materials and that mixing is conducted in a substantially anhydrous atmosphere.

The coating layer can be applied to the substrate surface by conventional means such as dipping, rolling, spraying, wiping to form a film, or by dispensing such as with a syringe. The solvent is permitted to evaporate and curing of any reactive functional groups may occur. This can be accomplished by heating to 50-200° C. or by simple exposure to ambient temperature, which is usually from 20-25° C.

Upon application to the substrate, the coating layer should be soft enough to allow for push-through electrical connectivity without failure of the coating. Failure would include cracking of the coating surface or delamination of the coating layer from the substrate that may lead to shorts or crosstalk in an electrical circuit. Softness of the coating layer may be afforded by the nature of the resinous components themselves, or by the addition of a suitable solvent, such as the use of the fluorinated solvents in combination with the fluorinated polymers.

The coating layer typically has a dry film thickness (DFT) of 100 nm to 100 microns, depending on the composition of the coating layer and the method of application to the substrate. For example, a spray-applied composition may have a dry film thickness of 100 to 200 nm. Spray-applied compositions comprising polysiloxanes and organometallic compounds may range in thickness from 10 to 15 microns, while the same compositions may demonstrate a dry film thickness of 20 to 25 microns when dispensed.

The term "cure", "cured" or similar terms, as used in connection with a cured or curable composition, e.g., a "cured composition" of some specific description, means that at least a portion of any polymerizable and/or cross-linkable components that form the curable composition is polymerized and/or crosslinked. Additionally, curing of a composition refers to subjecting said composition to curing conditions such as those listed above, leading to the reaction of the reactive functional groups of the composition. The term "at least partially cured" means subjecting the composition to curing conditions, wherein reaction of at least a portion of the reactive groups of the composition occurs. The composition can also be subjected to curing conditions such that a substantially complete cure is attained and wherein further curing results in no significant further improvement in physical properties, such as hardness.

The following examples are intended to illustrate various embodiments of the invention, and should not be construed as limiting the invention in any way.

Examples 1 to 3

Standard printed circuit board (PCB) test patterns (IPC-B-25A) meet the guidelines for testing conformal coatings (IPC-CC-830B) and solder masks (IPC-SM-804C) and have six different patterns printed on the surface, labeled A to F. Boards were cut vertically to isolate the E and F patterns, then to maintain testing uniformity, pattern F was used for immersion testing.

Prior to coating, the boards were cleaned with Ionox 13416 Cleaning Solvent available from Kyzen, rinsed with isopropyl alcohol, then blown dry with compressed air. This surface preparation was chosen to remove common contaminants such as flux residues, dust and other particulates which can result in coating deformities and provide conductive channels that would affect test results in an uncontrolled manner. Test boards were coated with three different surface treatments: Aculon® NanoProof™ 4.0 (Example 1), Aculon® NanoProof™ 3.5 (Example 2) and Aculon® NanoProof™ 5.0 (Example 3) in accordance with the present invention. Aculon® NanoProof™ 4.0 and 3.5 (Examples 1 and 2) are hydrophobic coatings comprising polysiloxanes, organometallic compounds, and a hydrocarbon solvent. Aculon® NanoProof™ 5.0 (Example 3) is a fluoroacrylic polymer in a fluorosolvent.

Dispensing and dip coating were used to demonstrate the flexibility of application options. For dip coating, a polyethylene container was filled with the coating solution so the coating solution did not cover the board when the bottle was laid horizontally. The bottle was then shaken 5 times to coat the board, laid down horizontally and let rest 30 seconds. The boards were then removed horizontally and let dry at room temperature overnight. The coating drainage time and angle of the boards during removal controlled the thickness of the coating. The shorter the drainage time and more horizontally the board is removed, the thicker the coating. After drying the boards were potted with a silicone based sealing compound so that just the F pattern was left exposed. Prior to testing the boards were inserted into a standard card edge connector wired to the power supply and sensor. The board was then placed in a beaker of water and tested.

Dispense coating was done with a syringe after the boards had been coated with a silicone sealant leaving the F pattern isolated and uncoated. A volume of coating solution was dispensed to achieve the desired thickness and the coating allowed to dry at room temperature. Then the circuit boards were connected to an external power supply and maintained at a constant voltage while using a digital ammeter to measure current across the electrodes.

Coated boards were subjected to three different water immersion tests. The water immersion tests were based on the IPX7 test standard (November, 2012) that has been established by the International Electrotechnical Commission (IEC). The IP Code, sometimes referred to as the Ingress Protection Rating, is used to assess how well coatings are able to protect circuitry and devices from exposure to water or other contaminants. In the IPX7 test, an unpowered electronic device is immersed in 1 meter of water for 30 minutes. After the 30 minutes, the device is removed and the power turned on. If it operates as it was designed, the device is considered to meet the IPX7 classification. Using two modifications of the IPX7 testing standard, powered test boards were immersed in water (Modification A) or salt water (Modification B) for an extended time period (60 minutes) at a variety of voltages. The circuit's current was measured while immersed and charted to determine the effect of the water on the circuitry. Increases in the measured current are due to the development of a conductive path (essentially making an electrochemical circuit) through the water medium between the two electrodes. Successful inhibition of such conduction is achieved by coatings that provide a barrier to ion migration.

For Modification A, the F pattern of an IPC-B-25A printed test board was coated with the compositions of Examples 1, 2, or 3 and compared with the F pattern on uncoated boards as a control. At all voltages the coated boards of the examples showed minimal to no corrosion, dendritic growth, copper loss or line thinning. Uncoated boards of the control showed significant corrosion, dendritic growth and line thinning.

Modification B included immersion in electrically conductive 5% aqueous sodium chloride. This modification approximates extremely aggressive 'real world' conditions like sweat immersion as sea water is on average 3.5% and sweat contains even less salinity. Sample boards were also tested at several voltages since power sources in electronic devices tend to vary substantially. A summary of the test methods is given in Table 1.

TABLE 1

IPX7 and Modifications A and B

| Test Method | Liquid Media | Time (Min) | Powered |
| --- | --- | --- | --- |
| IPX7 | Water | 30 | no |
| Modification A | Water | 60 | 3, 6, 12 Volts |
| Modification B | 5% aqueous NaCl | 60 | 3, 6, 12 Volts |

Using a BK Precision DC power supply model 1670A, a constant voltage of 3, 6, and 12 volts was applied to the test pattern. The development of current flow across the open comb F test pattern during the 60-minute immersion test was then measured with a Vernier Energy Sensor. After 60 minutes, the board was removed, rinsed with water and evaluated.

| Example | Modification A (3 V/6 V/12 V) | Modification B (3 V/6 V/12 V) |
| --- | --- | --- |
| 1 | PASS/PASS/PASS | PASS/PASS/PASS |
| 2 | PASS/PASS/PASS | PASS/PASS/PASS |
| 3 | PASS/PASS/PASS | PASS/PASS/PASS |

Even with an electrically-conductive fluid, the coated boards of Examples 1-3 protected the circuitry from damage, whereas instantaneous high current flow and dissolution of the copper traces was observed on uncoated (control) test boards. At extended time periods and increasing voltages, all of the copper traces were dissolved in the uncoated (control) boards where the coated boards of Examples 1-3 remained intact. This illustrates how effectively these coatings protect electronic circuitry.

Current leakage of less than 10 milliamps was observed with coated boards of Examples 1-3, whereas uncoated controls showed immediate and significant current leakage across the test circuit when using either Modification A or B. The solution color visibly changed to from colorless to pale blue in the case of uncoated boards, indicating the formation of dissolved copper ions as the traces dissolved. This coloration was not formed with the coated test substrates of Examples 1-3. Uncoated test patterns typically failed quickly after testing began as the leakage current was greater than 1 Ampere, indicating a complete shorting out of the circuit through the surrounding fluid. The coated boards of Examples 1-3 did not fail in this manner.

Examples 4 to 6

Strips of tin coated stainless steel were dip coated with coating Aculon® NanoProof™ 4.0 (Example 4), Aculon® NanoProof™ 3.5 (Example 5) or Aculon® NanoProof™ 5.0 (Example 6) in accordance with the present invention, and the conductivity measured over time to demonstrate push through electrical connections. For conductivity measurements a HP 34420A Nano Volt/Micro Ohm meter was used in 4 point probe mode with 2.54 mm gold coated Harwin spring probes. In every test condition, coated sample boards demonstrated a significant reduction in the amount of corrosion and degradation of the metal traces compared to uncoated samples boards.

Conductivity of the tin coated stainless steel samples was effectively unchanged over the measurement period, as shown in the tables below.

Average Surface Resistance for Uncoated Samples and Coated Samples (15 Minutes)

| Example | Average resistance uncoated | Average resistance 15 minutes |
| --- | --- | --- |
| 4 | $4.30 * 10_{-4}\ \Omega$ | $4.30 * 10_{-4}\ \Omega$ |
| 5 | $4.32 * 10_{-4}\ \Omega$ | $4.27 * 10_{-4}\ \Omega$ |
| 6 | $4.27 * 10_{-4}\ \Omega$ | $4.34 * 10_{-4}\ \Omega$ |

Average Surface Resistance for Uncoated Samples and Coated Samples (30 and 60 Minutes)

| Example | Average resistance 30 minutes | Average resistance 60 minutes |
| --- | --- | --- |
| 4 | $4.36 * 10-4\ \Omega$ | $4.33 * 10-4\ \Omega$ |
| 5 | $4.33 * 10-4\ \Omega$ | $4.27 * 10-4\ \Omega$ |
| 6 | $4.29 * 10-4\ \Omega$ | $4.34 * 10-4\ \Omega$ |

Whereas particular embodiments of this invention have been described above for purposes of illustration, it will be evident to those skilled in the art that numerous variations of the details of the present invention may be made without departing from the scope of the invention as defined in the appended claims.

What is claimed is:

1. A coated article comprising:
   (a) a substrate that demonstrates electrical conductivity; wherein the substrate is an electronic component of a circuit assembly and comprises an electrically conductive circuit pattern imprinted in or on the substrate surface; and
   (b) a coating layer applied to at least one surface of the substrate; wherein the coating layer demonstrates push-through electrical connectivity.

2. The coated article of claim 1 wherein the substrate is a printed circuit board.

3. The coated article of claim 1, wherein the coating layer is deposited from a film-forming composition comprising a polysiloxane and an organometallic compound in a solvent.

4. The coated article of claim 3 wherein the polysiloxane comprises poly(methylphenyl)siloxane and/or polydimethylsiloxane.

5. The coated article of claim 4 wherein the polysiloxane comprises terminal methyl and/or silanol groups.

6. The coated article of claim 3 wherein the organometallic compound has the structure $[M(O)_x(OH)_y(OR)_z]_n$ in which M is a transition metal; R is an alkyl group containing from 1 to 30 carbon atoms; $x+y+z=V$, wherein V is the valence of M; x is at least 1; y is at least 1; z is at least 1; $x=V-y-z$; $y=V-x-z$; $z=V-x-y$; and n is greater than 2.

7. The coated article of claim 6 wherein the metal is selected from at least one of La, Hf, Ta, W, and Nb.

8. The coated article of claim 3 wherein the solvent comprises isooctane.

9. The coated article of claim 1, wherein the coating layer is deposited from a film-forming composition comprising a fluorinated polymer in a fluorinated solvent.

10. The coated article of claim 9, wherein the film-forming composition further comprises a filler.

11. The coated article of claim 9, wherein the film-forming composition further comprises a viscosity modifying component.

12. The coated article of claim 1, wherein the coating layer has a dry film thickness of 100 nm to 100 microns.

13. The coated article of claim 1, wherein the coating layer is deposited from a film-forming composition comprising a hydrocarbon addition polymer in a hydrocarbon solvent.

14. The coated article of claim 13, wherein the film-forming composition further comprises a filler.

15. The coated article of claim 13, wherein the film-forming composition further comprises a viscosity modifying component.

16. The coated article of claim 13, wherein the hydrocarbon solvent comprises methyl cyclohexane, toluene, and/or cyclohexane.

17. The coated article of claim 1, wherein the coating layer is deposited from a film-forming composition comprising at least one terpolymer in a solvent, wherein the terpolymer is prepared from a reaction mixture comprising ethylene, propylene, and a diene.

18. The coated article of claim 17, wherein the diene comprises 5-ethylidenenorbornene (ENB) and/or dicyclopentadiene (DCPD).

* * * * *